United States Patent
Jiang

(10) Patent No.: US 8,666,354 B2
(45) Date of Patent: Mar. 4, 2014

(54) DISTRIBUTED, DIODE MIXER CIRCUIT

(75) Inventor: Xin Jiang, Chelmsford, MA (US)

(73) Assignee: Hittite Microwave Corporation, Chelmsford, MA (US)

( * ) Notice: Subject to any disclaimer, the term of this patent is extended or adjusted under 35 U.S.C. 154(b) by 507 days.

(21) Appl. No.: 12/661,391

(22) Filed: Mar. 15, 2010

(65) Prior Publication Data

US 2011/0221505 A1  Sep. 15, 2011

(51) Int. Cl.
*H04B 1/00* (2006.01)

(52) U.S. Cl.
USPC ........... 455/330; 455/112; 455/323; 455/331; 455/336

(58) Field of Classification Search
USPC ....................................................... 455/330
See application file for complete search history.

(56) References Cited

U.S. PATENT DOCUMENTS

| | | | |
|---|---|---|---|
| 3,772,599 A | 11/1973 | Ernst et al. | |
| 4,063,176 A | 12/1977 | Milligan et al. | |
| 4,125,810 A | 11/1978 | Pavio | |
| 4,224,572 A | 9/1980 | Will | |
| 4,306,311 A | 12/1981 | Igarashi | |
| 4,355,421 A | 10/1982 | Seely | |
| 5,428,829 A | 6/1995 | Osburn et al. | |
| 5,428,840 A | 6/1995 | Sadhir | |
| 5,854,974 A * | 12/1998 | Li | 455/330 |
| 6,205,324 B1 | 3/2001 | Bickford | |
| 6,275,689 B1 | 8/2001 | Gill | |
| 6,810,241 B1 | 10/2004 | Salib | |
| 6,850,575 B1 | 2/2005 | Ahmed | |
| 6,879,192 B2 * | 4/2005 | Merenda | 327/113 |
| 6,993,312 B1 | 1/2006 | Salib | |
| 7,013,122 B2 | 3/2006 | Gamliel | |
| 2001/0036818 A1 | 11/2001 | Dobrovolny | |
| 2002/0049043 A1 * | 4/2002 | Gamliel | 455/112 |
| 2005/0064840 A1 | 3/2005 | Heydari et al. | |
| 2005/0191985 A1 | 9/2005 | Bos et al. | |
| 2008/0003972 A1 | 1/2008 | Wyatt | |

OTHER PUBLICATIONS

Fong-Cheng Chang et al., A 4-41 GHz Single Balanced Distributed Mixer Using GaAs pHEMT Technology, IEEE Microwave and Wireless Components Letters, vol. 17, No. 2, Feb. 2007, pp. 136-138.

Amin Q. Safarian, et al., Design and Analysis of an Ultrawide-Band Distributed CMOS Mixer, IEEE Transactions on Very Large Scale Integration (VLSI) Systems vol. 13, No, 5, May 2005, pp. 618-629.

Won Ko and Youngwoo Kwon, A GaAs-Based 3-40 GHz Distribued Mixer with Cascode FET Cells, IEEE Radio Frequency Integrated Circuit Symposium 2004, pp. 413-416.

Kuo-Liang Deng, et al., A 3-33 GHz PHEMPT MMIC Distributed Drain Mixer, IEEE Radio Frequency Integrated Circuit Symposium, 2002, pp. 151-154.

(Continued)

*Primary Examiner* — Ajibola Akinyemi

(74) *Attorney, Agent, or Firm* — Iandiorio Teska & Coleman, LLP

(57) ABSTRACT

A distributed, diode mixer circuit includes a plurality of passive diode mixer cores including at least first and second passive diode mixer cores including doubly-balanced diodes in symmetrical balanced configuration forms, each mixer core having a pair of differential reference nodes driven by the reference signal and a pair of differential nodes driven by the data signal and a reactive impedance network including one or multiple reactive elements or transmission lines connected between the like nodes of each the first and second mixer cores.

13 Claims, 9 Drawing Sheets

(56) References Cited

OTHER PUBLICATIONS

On San A. Tang, et al., A Very Wide-Band Microwave MESFET Mixer Using the Distributed Mixing Principle, IEEE Transactions on Microwave Theory and Techniques, vol. 33, MIT, No. 12, Dec. 1985, pp. 1470-1478.

Written Opinion of the International Searching Authority, International Application No. PCT/US2011/000453, May 6, 2011, 4 pgs. (unnumbered).

* cited by examiner

DISTRIBUTED, DIODE MIXER CIRCUIT

FIELD OF THE INVENTION

This invention relates to a distributed, diode mixer circuit.

BACKGROUND OF THE INVENTION

Mixer circuits are generally used to convert an input signal at one frequency to another frequency according to a local oscillator (LO) frequency. For down conversion applications, mixers convert higher input frequency e.g. radio frequency (RF) to a lower output frequency e.g. intermediate frequency (IF), and for up conversion applications, the input frequency will be a lower frequency IF signal and the output will be higher frequency RF signal. The local oscillator (LO) frequency or signal is also known as the reference frequency or signal and the higher, radio frequency (RF) frequency or signal is also known as the data frequency signal. Those frequency conversions are realized through the non-linear operations of the mixer cores embedded in the mixer circuits. Along with the desired mixed output signal, the mixer typically generates other intermodulation products and port-to-port leakages that are preferably suppressed. Mixer designs can be categorized into one of three topologies: single-ended mixer, single-balanced mixer and double balanced mixer. The double balanced topology employs balanced mixing core structures, such as ring, bridge or star forms, and the mixer cores are usually driven differentially by two baluns. This balanced differential drive provides high isolation from port to port, high rejection of even-mode harmonics and intermodulation products and high power handling (thus, good dynamic range). Therefore, double-balanced topology is usually the preferred choice for high-performance applications. Broadband mixing core topologies have been previously proposed and studied in papers, such as Fong-Cheng Chang, et al., "A 4-41 GHz Single Balanced Distributed Mixer Using GaAs pHEMT Technology", IEEE Microwave and Wireless Components Letters, Vol. 17, No. 2. February 2007 and Amin Q. Safarian, et al., "Design and Analysis of an Ultrawide-Band Distributed CMOS Mixer", IEEE Trans. On Very Large Scale Integration (VLSI) Systems, Vol. 13, No. 5, May, 2005, U.S. Pat. No. 4,125,810 to Pavio, U.S. Pat. No. 4,224,572 to Will, U.S. Pat. No. 4,355,421 to Seely, U.S. Pub. No. US2005/0064840A1 to Heydari, U.S. Pat. No. 6,850,575B1 to Ahmed, U.S. Pat. No. 6,993,312 B1 to Salib, and U.S. Pat. No. 7,013,122 B2 to Gamliel. Among them the balanced distributed topologies are one of the most promising approaches to achieve ultra-wide bandwidth without degradation of other mixer performance. However, all of the previous double-balanced distributed mixers are either active (or Gilbert-cell based) mixers that require active bias currents or single-balanced FET based mixers. Both topologies suffer from poor power handling capability and low linearity. In addition, the active distributed mixers have poor noise performance. And single-balanced distributed FET mixers suffer from low port-to-port isolation compared with double-balanced mixers. In summary, existing passive distributed-mixer designs are either single-balanced or totally un-balanced which lead to poor isolation between ports. The active double balanced distributed mixers can provide good isolation using balanced topologies but suffer from poor noise performance, which greatly limits the active mixer's dynamic range.

One prior art approach, U.S. Pat. No. 5,854,974 uses a compensation inductor between the differential reference (LO) nodes of a diode ring to resonate with the capacitive reactance of the diode ring at the reference (LO) frequency. This inductor is located across the differential output of the reference (LO) balun in parallel with the diode ring and it will cancel out the capacitance exhibited by diode ring at reference (LO) frequency. In this way, the linearity is improved with reduced $3^{rd}$ order harmonics at reference (LO) frequency. Also disclosed was the use of two inductors with two ring mixer cores where each inductor is connected across the reference (LO) differential nodes of each ring to resonate with each ring's capacitance at reference (LO) frequency. However, because of the resonance nature of this design, this approach only works for a narrow reference (LO) frequency bandwidth and therefore it is not suitable for broadband designs.

SUMMARY OF THE INVENTION

It is therefore an object of this invention to provide an improved distributed, diode mixer circuit.

It is a further object of this invention to provide such an improved distributed, diode mixer circuit which requires no bias circuit for the mixer cores and significantly reduces power requirements.

It is a further object of this invention to provide such an improved distributed, diode mixer circuit which provides good port to port signal isolation, low noise, good linearity, broad band range of operation, and no need for termination resistors which further reduces power requirements.

It is a further object of this invention to provide such an improved distributed, diode mixer circuit which has a mixing bandwidth ratio of as high as 10:1.

The invention results from the realization that an improved mixer circuit with the low, noise good linearity, broad band operation of a distributed reactive high impedance network and the no bias circuit of diode networks can be achieved by employing two or more passive diode mixer cores of balanced-connected unbiased diodes with a distributed reactive high impedance network with a reactive impedance connected between the nodes of each of the mixer cores.

The subject invention, however, in other embodiments, need not achieve all these objectives and the claims hereof should not be limited to structures or methods capable of achieving these objectives.

This invention features a distributed, diode mixer circuit including a plurality of passive diode mixer cores including at least first and second passive diode mixer cores including doubly-balanced diodes in symmetrical balanced configuration forms, each mixer core having a pair of differential reference nodes driven by the reference signal and a pair of differential nodes driven by the data signal, and a reactive impedance network including one or multiple reactive elements or transmission lines connected between the like nodes of each of the first and second mixer cores.

In preferred embodiments there may be a third passive diode mixer core and a second distributed high impedance network including a reactive impedance connected between the like nodes of the third mixer core and one of the first and second mixer cores. Each mixer core may include at least four diodes in a ring configuration, where each branch of the ring may be composed of one or plurality of diodes. The reactive impedances may include inductances. The reactive impedances may include high impedance transmission lines. Each mixer core may include a four leg diode star with at least one diode in each leg. There may be a reference balun for providing the differential reference signal and a data balun for providing the differential data signal.

A distributed diode mixer circuit includes a reference balun for providing a differential reference signal and a data balun for providing a differential data signal, and a plurality of passive diode mixer cores including at least first and second passive diode mixer cores including doubly-balanced diodes in symmetrical balanced configuration forms, each mixer core having a pair of differential reference nodes driven by the reference signal and a pair of differential nodes driven by the data signal. A reactive impedance network including one or multiple reactive elements or transmission lines is connected between the like nodes of each of the first and second mixer cores.

In preferred embodiment there may be a third passive diode mixer core and a second distributed high impedance network including a reactive impedance connected between the like nodes of the third mixer core and one of the first and second mixer cores. Each mixer core may include at least four diodes in a ring configuration, where each branch of the ring may be composed of one or plurality of diodes. The reactive impedances may include inductances. The reactive impedances may include high impedance transmission lines. Each mixer core may include a four leg diode star with at least one diode in each leg.

BRIEF DESCRIPTION OF THE DRAWINGS

Other objects, features and advantages will occur to those skilled in the art from the following description of a preferred embodiment and the accompanying drawings, in which:

FIGS. 3, 4 and 4-1 are schematic diagrams of alternative mixer cores useable in FIGS. 1 and 2;

DETAILED DESCRIPTION OF THE INVENTION

Figure 1:
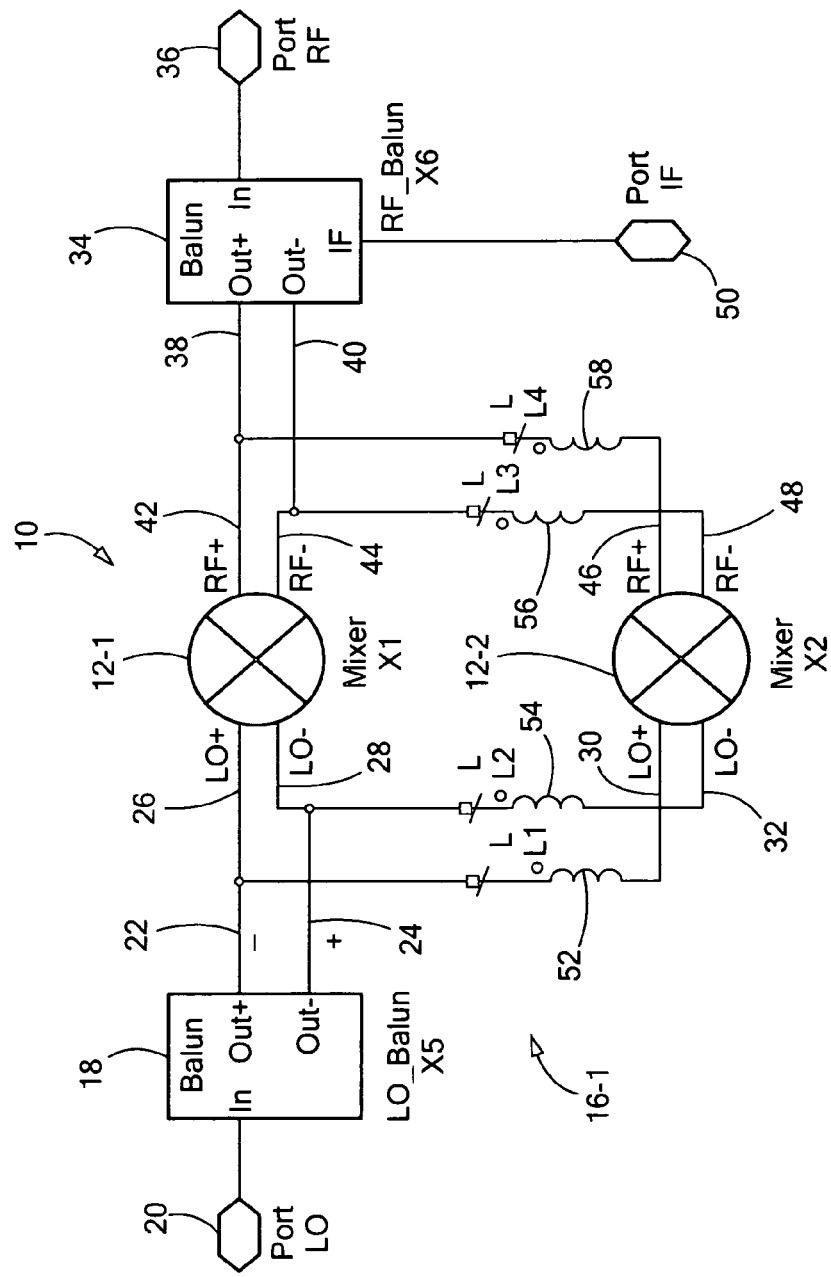
FIG. 1 is a block diagram of a distributed diode mixer circuit according to this invention with reference (LO) and data (RF) baluns.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

This invention provides multiple similar-type mixing cores that are connected with inductive high-impedance networks in a tandem manner. The invention presents a solution for mixers that provide multi-octave bandwidth and can be implemented with compact circuit size using most commonly available semiconductor and other planar fabrication processes. It can provide over ultra-wide bandwidth both desired good isolation and high dynamic range. Those combined features are not achievable with current passive distributed mixer or active distributed mixer topologies.

The proposed passive double-balanced mixer combines the advantages of both double-balance topology and the passive operations and achieves good port-to-port isolation and high dynamic range. Over the entire operation band from 0.6 to 6 GHz, isolation between LO-to-RF is greater than 34 dB, single-side-band noise figure is equal to conversion loss and input IP3 is better than 18 dBm in the specific embodiment disclosed.

The mixer circuit of this invention provides multi-octave signal conversion bandwidth. In the mixer example presented here, a double balanced mixer demonstrates lower than 10-dB conversion loss from 0.6 to 6 GHz, a 1-to-10 bandwidth ratio. The invention can be realized with both distributed coupling lines and lumped elements. Both alternatives can be readily fabricated in most semiconductor and other planar fabrication processes. The lumped element approach requires the least real-estate and presents the solution with the most compact circuit footprint for radio frequency and microwave frequency applications.

To overcome the limitations of the active distributed and single-balanced distributed Fet prior art mixers, this invention presents a new distributed balanced diode-based approach that not only preserves the advantages of conventional double balanced diode mixers but also provides ultra-wide bandwidth brought by the distributed approach. Especially when the baluns associated with the mixer are not the frequency limiting factor, this invention presents better broadband mixing core topology fitting for most wide band applications.

There is shown in FIG. 1 a mixer circuit 10 according to this invention including two or more mixer cores 12-1, 12-2 interconnected by distributed reactive high impedance network 16-1. Hereinafter in the embodiments disclosed the reference signal or frequency will be referred to as the local oscillator frequency or signal (LO) and the data signal or frequency will be referred to as the radio frequency (RF) frequency or signal as will the associated circuitry. LO balun 18 may receive in one direction the single ended LO input at LO port 20 and convert it to positive and negative output signals on lines 22, 24. These are provided to the positive and negative LO nodes 26, 28 and 30, 32 of mixer cores 12-1 and 12-2, respectively. Similarly, RF balun 34 may receive a single ended input at RF port 36 and split it into differential positive and negative outputs on lines 38 and 40 which it delivers to the RF positive and RF negative nodes 42, 44, 46 and 48 at mixer cores 12-1 and 12-2, respectively. The mixed output (IF) can be obtained from a tap on balun 34 brought out on IF output port 50. Distributed reactive high impedance network 16-1 in this embodiment, where there are but two mixer cores 12-1 and 12-2, includes four reactive impedances 52, 54, 56 and 58. In this specific example these reactive impedances are inductances; other impedances may be used, for example, high impedance transmission lines or they may be a combination of both. Note that each reactive impedance 52, 54, 56, 58 is connected between like nodes of each of the mixer cores 12-1 and 12-2. For example, reactive impedance 52 is connected between LO plus node 26 of mixer 12-1 and the LO plus node 30 of mixer 12-2. Reactive impedance 54 is connected between the LO minus node 28 of mixer 12-1 and the LO minus node 32 of mixer 12-2. Reactive impedance 56 is connected between the RF minus node 44 of mixer 12-1 and the RF minus node 48 of mixer 12-2. And reactive impedance 58 is connected between the RF positive node 42 of mixer 12-1 and RF positive node 46 of mixer 12-2.

Figure 2:
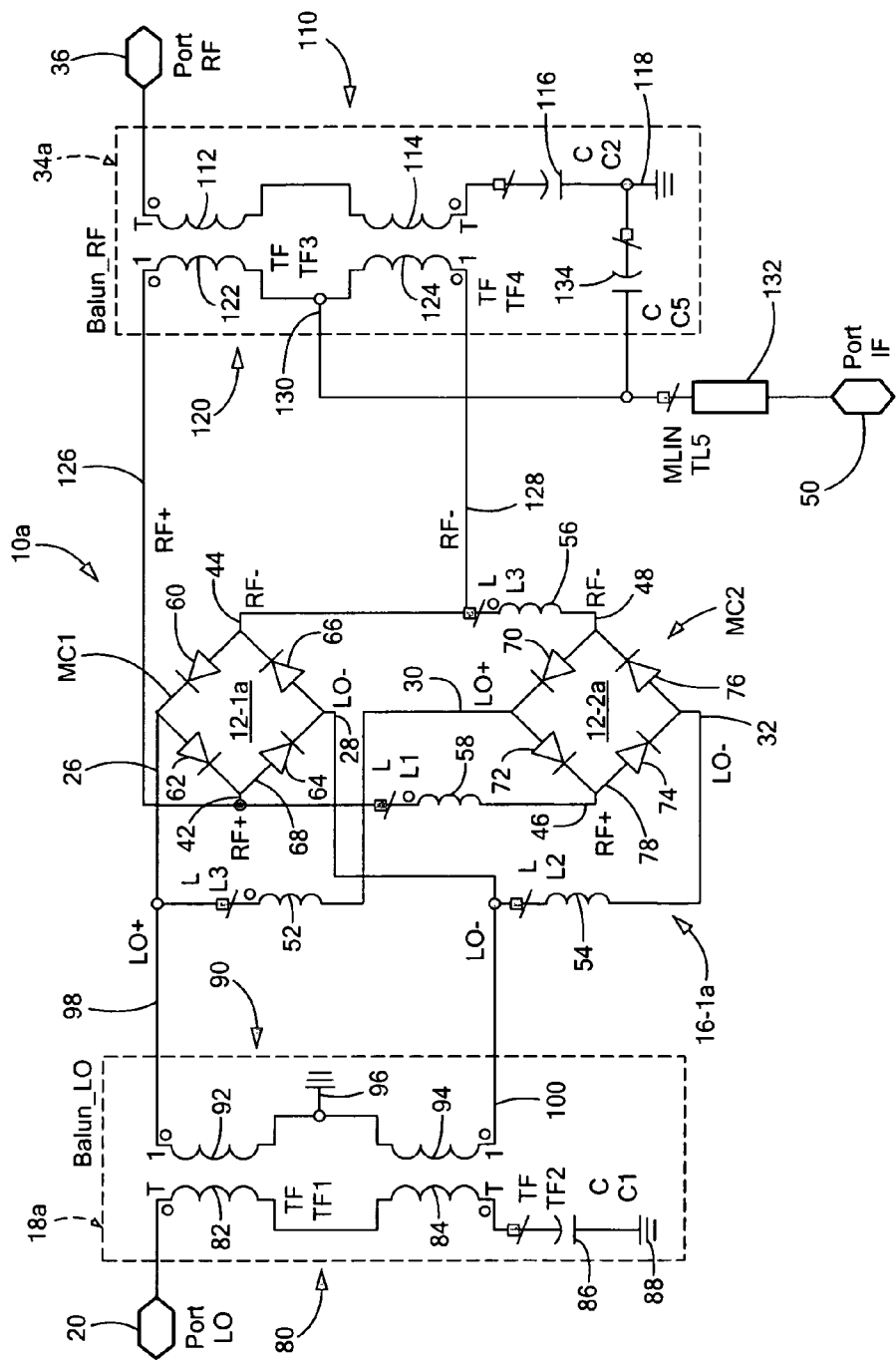
FIG. 2 is a more detailed schematic of the circuit of FIG. 1.
Figure 3:
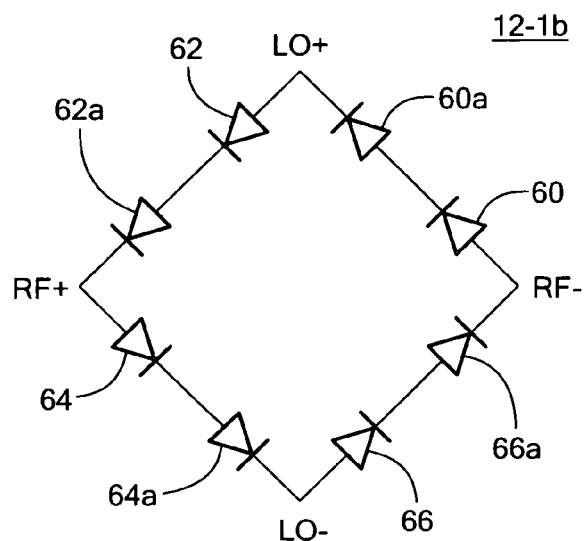
Figure 4:
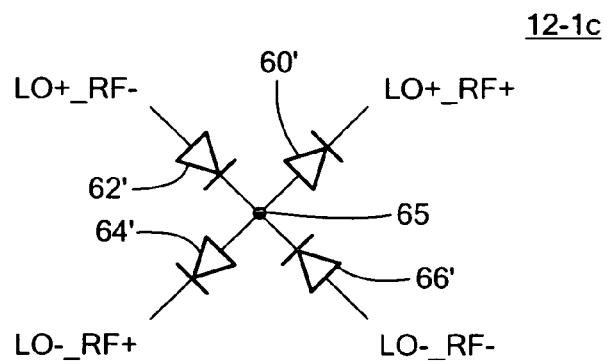
Figures 1, 4:
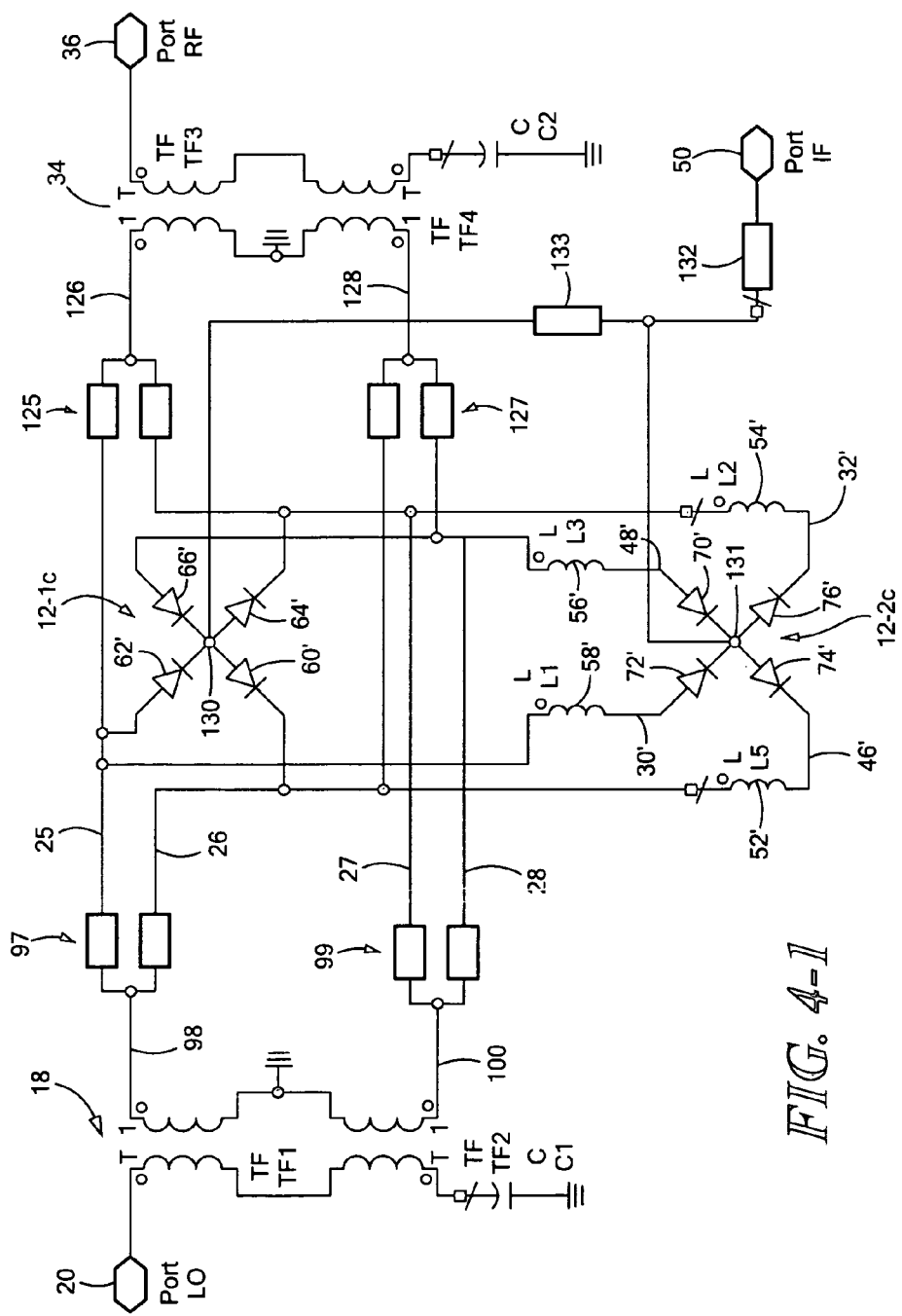

In one specific implementation, FIG. 2, mixer circuit 10a includes mixer cores 12-1a and 12-2a each formed of a diode ring of four diodes 60, 62, 64 and 66 connected anode to cathode to form ring 68 of mixer 12-1*a* and diodes 70, 72, 74, and 76 connected anode to cathode to form ring 78 of mixer core 12-2*a*. LO balun 18*a* and RF balun 34*a* may be typical single ended to balanced baluns. LO balun 18*a* may include a primary winding 80 including two sections 82 and 84 connected in series through AC capacitor 86 to ground 88. Balun 18*a* also may include a secondary winding 90 having two sections 92 and 94 with a grounded center tap 96. Secondary winding 90 provides LO plus output 98 to nodes 26 and 30 of mixer cores 12-1*a* and 12-2*a*, respectively, and a second output LO minus at 100 to nodes 28 and 32 of mixer cores 12-1*a* and 12-2*a*, respectively. Balun 34*a* includes primary winding 110 having two sections 112 and 114 connected in series through AC ground capacitor 116 to ground 118. Secondary winding 120 includes two sections 122 and 124 connected in series together to provide one output 126 RF+ to nodes 42 and 46 of mixer cores 12-1*a* and 12-2*a*, respectively, and a second output 128 providing RF− to nodes 44 and 48 of mixer cores 12-1*a* and 12-2*a*, respectively. The mixed output may be taken anywhere at any one of the nodes of mixer cores 12-1*a* and 12-2*a* but it is more usually taken from the center tap 130 of secondary winding 120. From there it is delivered through high impedance transmission line or microstrip line 132 to IF port 50. Capacitor 134 may be provided for filtering for the IF part of the signal and as an AC ground for center tap 130. Although thus far the passive diode mixer cores have been shown implemented as a four diode ring in FIG. 2, this is not a necessary limitation of the invention. For example as shown in FIG. 3, there may be a number of diodes in each leg. Using mixer core 12-1*b* as an example, each leg of the ring then may include two diodes 60, 60*a*; 62, 62*a*; 64, 64*a*, and 66, 66*a*. In fact any number of diodes per leg may be used wherein the total number is typically some integral multiple of four. The passive diode mixer cores according to this invention are not limited to ring configurations. For example, they may be employed in a star configuration as indicated at 12-1*c*, FIG. 4, where the diodes are connected to one common node 65 and the differential ports of the LO and RF signals are alternately interconnected to drive the star mixing core. Thus, for example, in FIG. 2 if the passive diode mixer cores 12-1*a* and 12-2*a* were implemented by a star configuration, such as 12-1*c*, FIG. 4, the signals for driving each of the diodes LO+, RF−; LO+, RF+, LO−, RF−; LO−, RF+, would be obtained by splitting the LO+, LO−, RF+, and RF− signals at node 98, 100, 126, and 128 in FIG. 4-1 through coupled lines 97, 99, 125 and 127. In this way, the diode 62' in first mixer core of 12-1C is driven by both LO+ and RF+ at node 25, and diode 72' in second mixer core of 12-2C is driven at node 30' by the same LO+ and RF+ signal passing the high impedance network composed of 58' in this case. The mixed output signal may be taken from 130 and 131 in FIG. 4-1 through transmission lines 133 and 132 to port 50. The tightly coupled line pairs 97, 99, 125 and 127 usually are quarter-wave length long to achieve desired good balance operations and high isolations between LO and RF signal ports.

Figure 5:
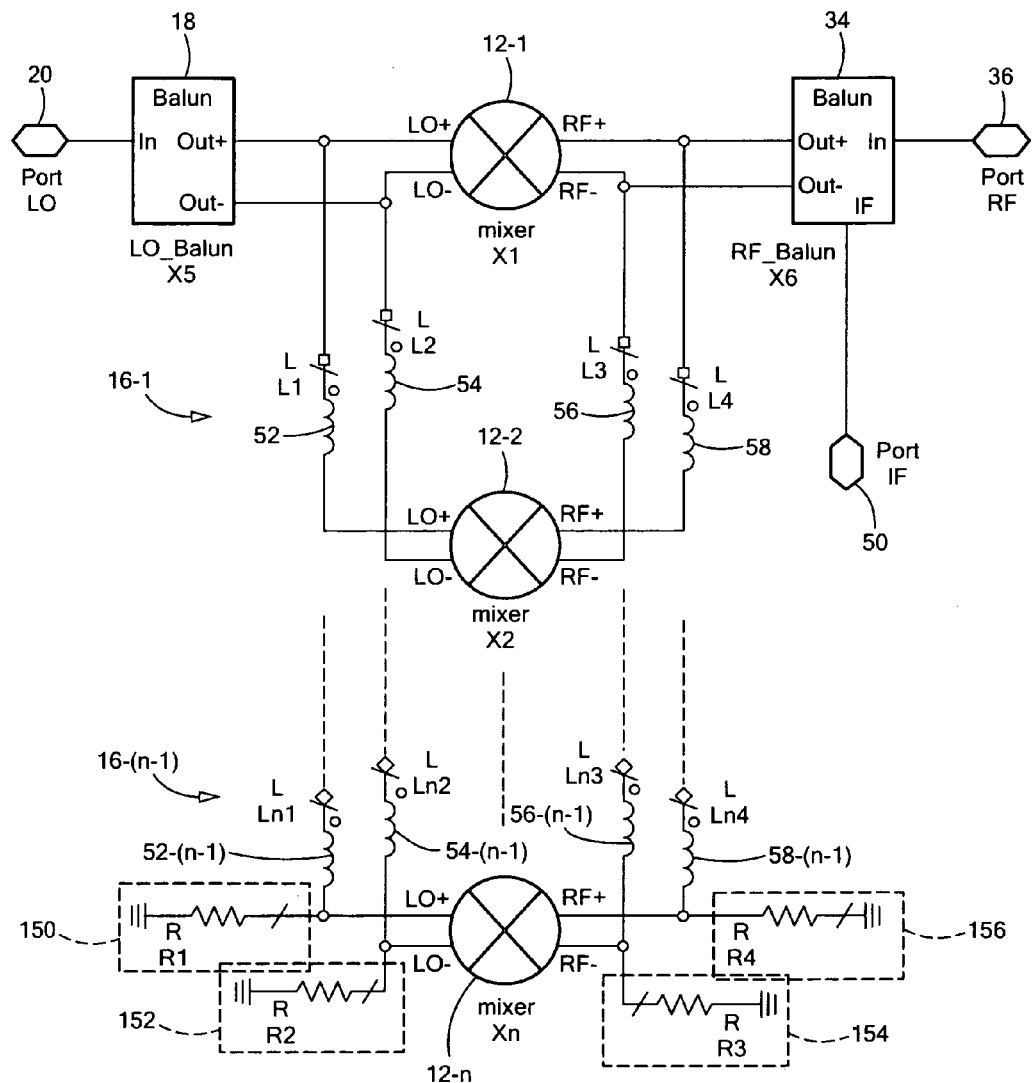
FIG. 5 is a view similar to FIG. 1 illustrating the use of any number of mixer cores.

The examples in FIGS. 1 and 2 have shown the use of only two mixer cores, 12-1 and 12-2, but this is not a necessary limitation of the invention. As shown in FIG. 5 there may be any number of mixer cores 12-1, 12-2, 12-*n* and there will then be (n−1) distributed high impedance networks 16-1, through 16-(*n*−1), where each reactive impedance in each of those distributed high impedance networks is connected between like nodes of neighboring mixer cores. For example: the first network 16-1 of impedances 52-58 is connected between mixer core 12-1 and 12-2; the distributed high impedance network 16-(*n*−1) which includes reactive impedances 52-(*n*−1), 54-(*n*−1), 56-(*n*−1), and 58-(*n*−1) extends between the nodes of mixer core 12-*n* and the next previous mixer core. Termination resistors 150, 152, 154, and 156 are also shown in FIG. 5 but these are not required with this invention and preferably may be and are usually omitted to further reduce power consumption.

Figure 6:
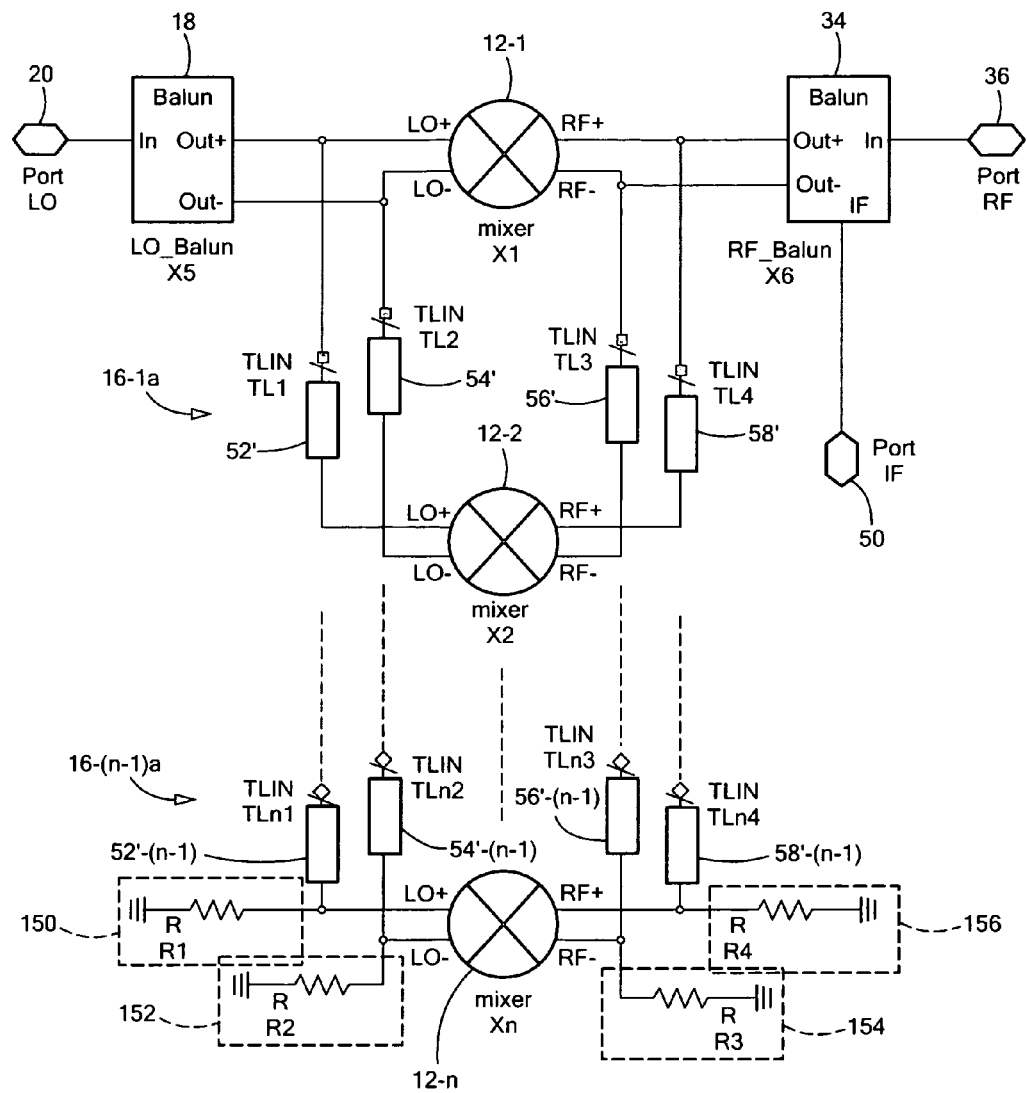
FIG. 6 is a view similar to FIG. 5 illustrating high impedance transmission lines replacing the inductors in the distributed network.
Figure 7:
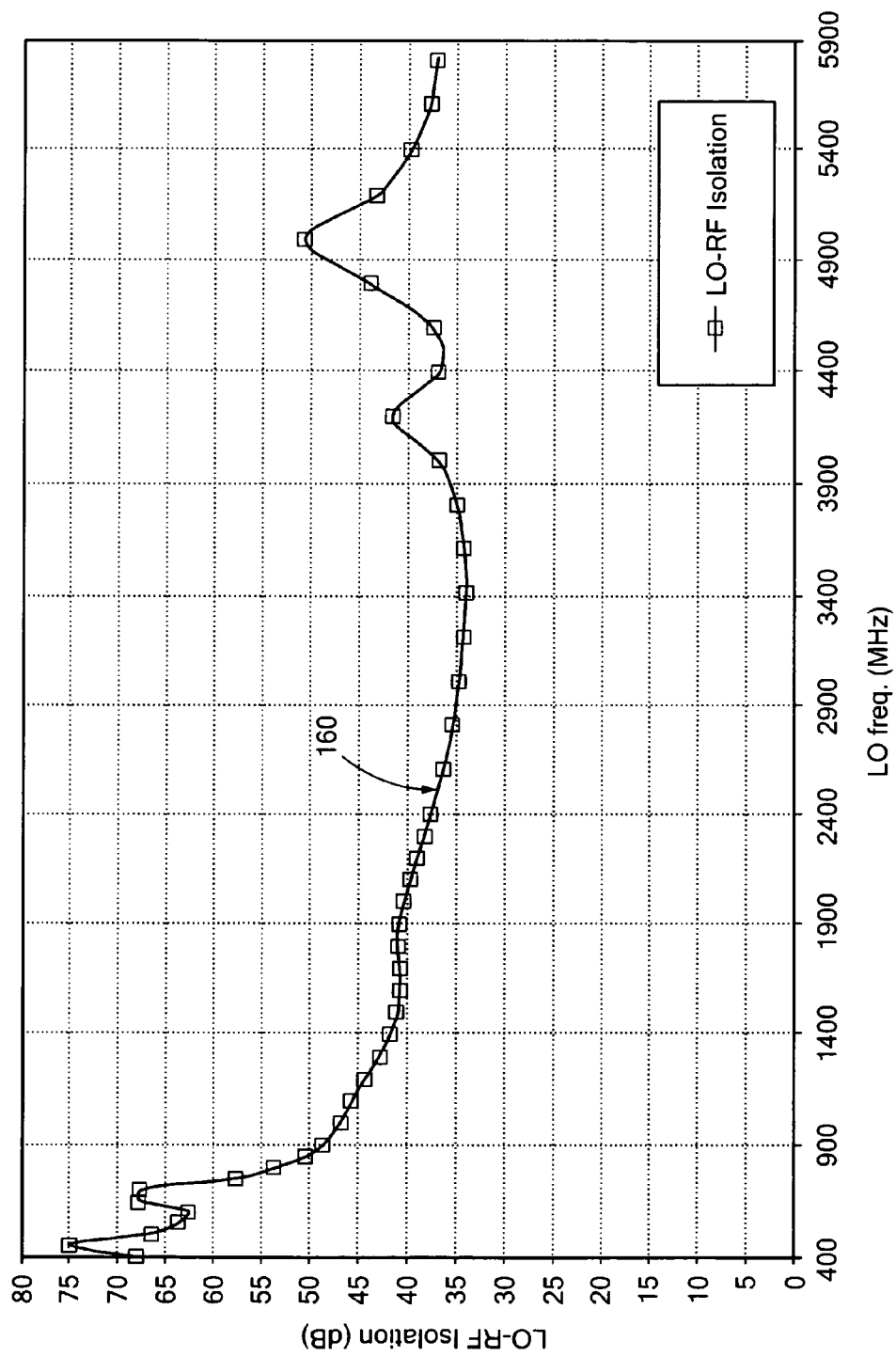
FIG. 7 is a graphical illustration of the improved isolation achieved with this invention.
Figure 8:
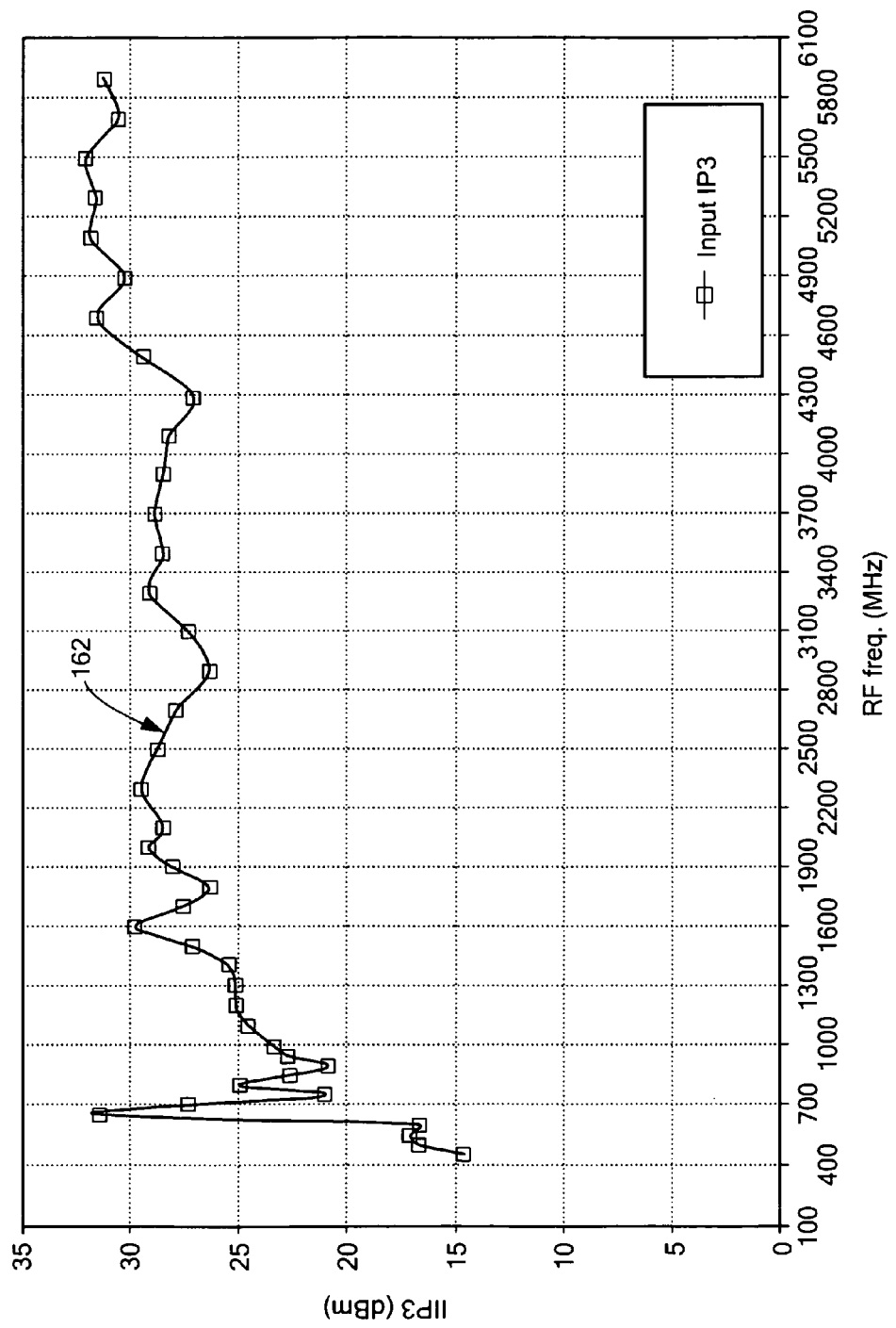
FIG. 8 is a graphical illustration of the improved $3^{rd}$ harmonic separation achieved with this invention.
Figure 9:
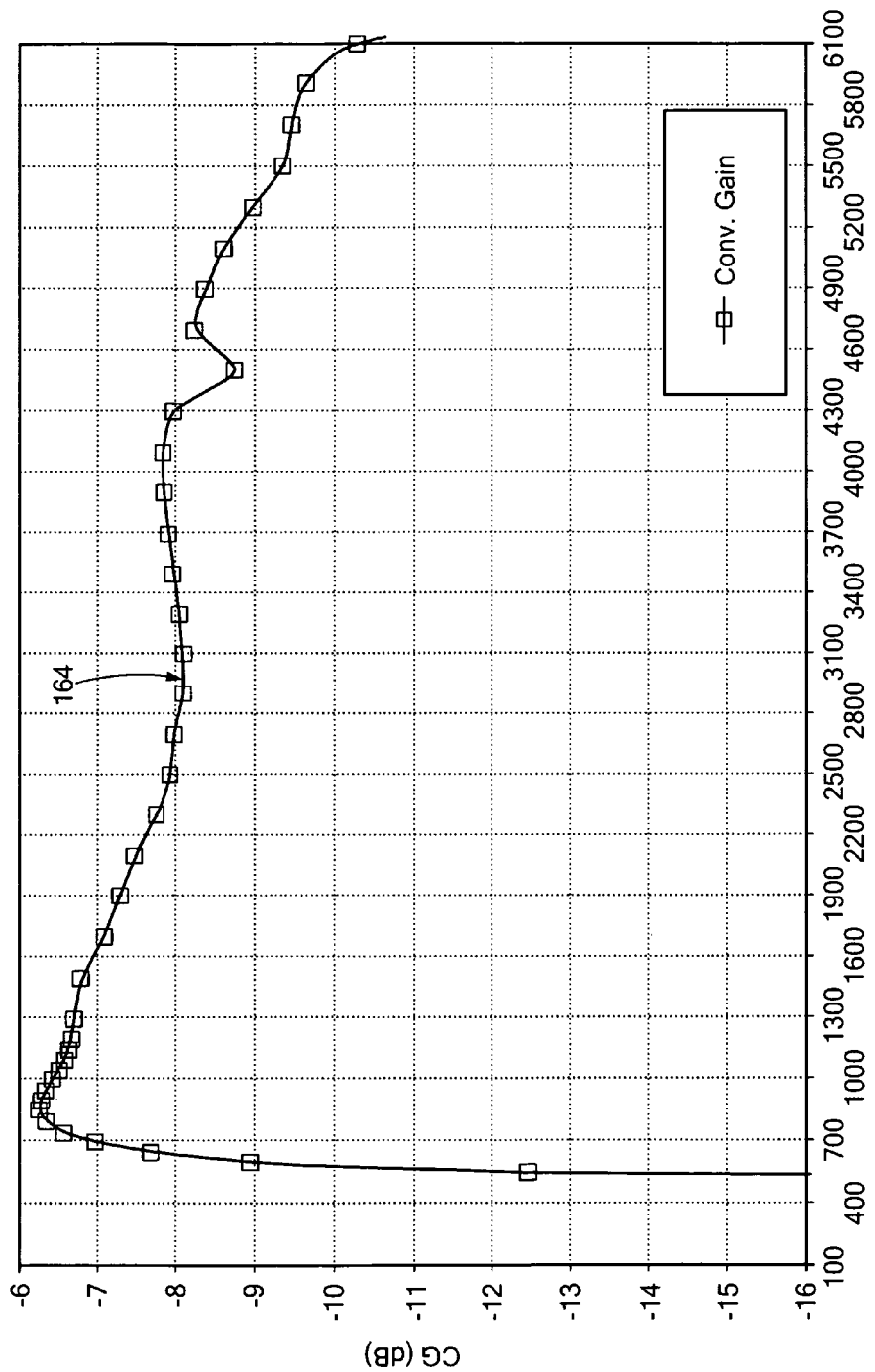
FIG. 9 is a graphical illustration of the improved convergent gain achieved with this invention.

Thus far, the examples have shown the reactive impedances as inductors 52-(*n*−1)-58-(*n*−1), but other types of impedances may be used such as high impedance transmission lines 52'-58', FIGS. 6 and 52'-(*n*−1)-58'-(n−1). The efficacy of the invention may be further appreciated with respect to FIGS. 7, 8 and 9, where the measured performance results of mixer designed based on this invention are illustrated. In the measurements, the LO frequency is set at 100 MHz lower than RF frequency. FIG. 7 illustrates the LO−RF isolation 160, FIG. 7, where between 400 and 5900 MHz of LO frequency the isolation is at least approximately 35 dB's down. The input intercept point (IIP) of the third harmonic characteristic 162 FIG. 8 indicates how far the third spurious harmonic power level is below the fundamental signal, and here again the typical value of 25 dBm corresponds to 50 dB suppression of the third order spurs at the input RF power level of 0 dBm. The convergent gain (CG) 164, FIG. 9, indicates how much the of the RF is actually converted to IF and here it can be seen to be quite substantial over a broad range of RF frequency from approximately 600 MHz up to 6 GHz.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A distributed, diode mixer circuit comprising:
   a plurality of passive diode mixer cores including at least first and second passive diode mixer cores including doubly-balanced diodes in symmetrical balanced configuration forms, each mixer core having differential first and second reference nodes driven by the reference signal and differential first and second data nodes driven by the data signal; and
   a reactive impedance network including one or multiple reactive elements or transmission lines connected between the like nodes of each said first and second mixer cores, the reactive impedance network including:
   a first impedance between the first reference nodes of the first and second passive diode mixer cores,
   a second impedance between the second reference nodes of the first and second passive diode mixer cores, a third impedance between the first data nodes of the first and second passive diode mixer cores, and a fourth impedance between the second data nodes of the first and second passive diode mixer cores.

2. The distributed diode mixer circuit of claim 1 in which there is a third passive diode mixer core and a second distributed high impedance network including a reactive impedance connected between the like nodes of said third mixer core and one of said first and second mixer cores.

3. The distributed diode mixer circuit of claim 1 in which each said mixer core includes at least four diodes in a ring configuration, where each branch of the ring may be composed of one or plurality of diodes.

4. The distributed diode mixer circuit of claim 1 in which said reactive impedances include inductances.

5. The distributed diode mixer circuit of claim 1 in which said reactive impedances include high impedance transmission lines.

6. The distributed diode mixer circuit of claim 1 in which each said mixer core includes a four leg diode star with at least one diode in each leg.

7. The distributed diode mixer circuit of claim 1 further including a reference balun for providing said differential reference signal and a data balun for providing said differential data signal.

8. A distributed diode mixer circuit comprising:
a reference balun for providing a differential reference signal and a data balun for providing a differential data signal;
a plurality of passive diode mixer cores including at least first and second passive diode mixer cores including doubly-balanced diodes in symmetrical balanced configuration forms, each mixer core having differential first and second reference nodes driven by said reference signal and differential first and second data nodes driven by said data signal; and
a reactive impedance network including one or multiple reactive elements or transmission lines connected between the like nodes of each said first and second mixer cores the reactive impedance network including:
a first impedance between the first reference nodes of the first and second passive diode mixer cores,
a second impedance between the second reference nodes of the first and second passive diode mixer cores,
a third impedance between the first data nodes of the first and second passive diode mixer cores, and
a fourth impedance between the second data nodes of the first and second passive diode mixer cores.

9. The distributed diode mixer circuit of claim 8 in which there is a third passive diode mixer core and a second distributed high impedance network including a reactive impedance connected between the like nodes of said third mixer core and one of said first and second mixer cores.

10. The distributed diode mixer circuit of claim 8 in which each said mixer core includes at least four diodes in a ring configuration, where each branch of the ring may be composed of one or plurality of diodes.

11. The distributed diode mixer circuit of claim 8 in which said reactive impedances include inductances.

12. The distributed diode mixer circuit of claim 8 in which said reactive impedances include high impedance transmission lines.

13. The distributed diode mixer circuit of claim 8 in which each said mixer core includes a four leg diode star with at least one diode in each leg.

* * * * *